United States Patent
Tanaka et al.

(10) Patent No.: US 6,974,909 B2
(45) Date of Patent: Dec. 13, 2005

(54) IC MODULE, AND WIRELESS INFORMATION-STORAGE MEDIUM AND WIRELESS INFORMATION-TRANSMITTING/ RECEIVING APPARATUS INCLUDING THE IC MODULE

(75) Inventors: Junichi Tanaka, Kanagawa (JP); Hiroyuki Takubo, Kanagawa (JP); Shigenobu Abe, Miyagi (JP)

(73) Assignee: Sony Corporation (JP)

( * ) Notice: Subject to any disclaimer, the term of this patent is extended or adjusted under 35 U.S.C. 154(b) by 90 days.

(21) Appl. No.: 10/443,789

(22) Filed: May 23, 2003

(65) Prior Publication Data
US 2004/0008498 A1 Jan. 15, 2004

(30) Foreign Application Priority Data

Jun. 7, 2002 (JP) .................................... P2002-167159
Dec. 6, 2002 (JP) .................................... P2002-355108

(51) Int. Cl.⁷ ........................... H05K 5/06; H01L 23/28
(52) U.S. Cl. ..................... 174/52.2; 257/676; 361/734
(58) Field of Search .............................. 174/52.2, 52.4; 257/676; 361/734

(56) References Cited

U.S. PATENT DOCUMENTS 5,420,757 A * 5/1995 Eberhardt et al. .......... 361/813

| 5,844,307 A | 12/1998 | Suzuki et al. |
| 6,023,407 A | 2/2000 | Farooq et al. |
| 6,624,743 B1 | 9/2003 | Ikefuji et al. |
| 6,724,638 B1 | 4/2004 | Inagaki et al. |

FOREIGN PATENT DOCUMENTS

| CN | 1148733 A | 4/1997 |
| CN | 1242092 A | 1/2000 |
| CN | 1321410 A | 11/2001 |
| EP | 0 801 358 A2 | 10/1997 |
| EP | 1 022 677 A1 | 7/2000 |

OTHER PUBLICATIONS

EPO Search Report dated Oct. 6, 2003.

Chinese Office Action.

U.S. Appl. No. 10/780,856, Inagaki et al., filed Aug. 19, 2004.

* cited by examiner

*Primary Examiner*—Hung V. Ngo
(74) *Attorney, Agent, or Firm*—Rader, Fishman & Grauer, PLLC; Ronald P. Kananen

(57) ABSTRACT

An IC module includes a lead frame having terminals that are to be connected to an antenna coil of an IC card, and an IC chip and multilayer chip capacitors for tuning mounted on the lead frame and encapsulated by a resin. The multilayer chip capacitors are mounted in grooves on the lead frame.

19 Claims, 7 Drawing Sheets

IC MODULE, AND WIRELESS INFORMATION-STORAGE MEDIUM AND WIRELESS INFORMATION-TRANSMITTING/RECEIVING APPARATUS INCLUDING THE IC MODULE

BACKGROUND OF THE INVENTION

1. Field of the Invention

The present invention relates to an IC module in which an IC chip and tuning capacitor are integrated, and to a wireless information-storage medium or a wireless information-transmitting/receiving apparatus, such as a contactless IC card, including the IC module.

2. Description of the Related Art

A wireless information-storage medium of the type mentioned above (hereinafter referred to as an IC card) includes a loop antenna, an IC chip connected to terminals of the loop antenna, and tuning capacitors formed on a principal surface of a plastic card substrate. The wireless information-storage medium is used, for example, for checking transportation tickets or management of room entry and exit.

When the contactless IC card is placed in proximity to a loop antenna of a reader/writer (i.e., a device for reading and writing) that is provided separately, an induced voltage is generated between the terminals of the loop antenna of the IC card by electromagnetic induction. The IC chip receives a power-supply voltage obtained by stabilizing the induced voltage, and demodulates a modulated wave transmitted from the reader/writer, thereby receiving data transmitted from the reader/writer. When data stored in a memory of the IC chip is to be transmitted to the reader/writer, a load in the IC chip is varied according to the data to change the terminal impedance of the loop antenna, and the reader/writer demodulates a modulated wave transmitted from the IC card to detect the variation of the load, thereby receiving the data from the IC card.

When the contactless IC card is manufactured, capacitors for tuning the signal frequency f of an antenna coil are also formed on the substrate. Since the signal frequency f of the antenna coil can be expressed as $f=1/(2\pi\sqrt{(LC)})$, where C denotes the capacitance of the capacitors and L denotes the inductance of the antenna coil, the signal frequency of the antenna coil is tuned by adjusting the capacitance of the capacitors.

More specifically, with a polyimide film or a polyethylene naphthalate film forming the substrate as an insulator, electrodes of copper or aluminum are formed on both sides of the film, whereby film capacitors are formed on the substrate.

The film capacitors constructed as described above, however, suffer low precision of capacitance because of non-uniformity in the thickness of polyimide films or polyethylene naphthalate films manufactured. Thus, a final product actually requires a delicate adjustment of capacitance by trimming.

Furthermore, since variation of dielectric loss tangent (tanθ) in relation to temperature change is large in capacitors that are formed using a polyimide film or a polyethylene naphthalate film, it is inhibited to satisfy desired temperature characteristics of the tuning capacitors.

As for multilayer chip capacitors, although manufacturing precision of capacitance is high and temperature characteristics are favorable, a thickness on the order of 300 μm inhibits their use in very thin devices such as IC cards.

SUMMARY OF THE INVENTION

Accordingly, it is an object of the present invention to provide a thin IC module including a capacitor having a precise capacitance and favorable temperature characteristics, and a wireless information-storage medium and a wireless information transmitting/receiving apparatus including the IC module.

The present invention, in one aspect thereof, provides an IC module including a lead frame having terminals that are to be connected to an antenna coil for carrying out communication with an external communication device; an IC chip mounted on the lead frame; a multilayer chip capacitor mounted on the lead frame; and a resin that encapsulates the IC chip and the multilayer chip capacitor.

The multilayer chip capacitor is preferably mounted in a groove on the lead frame. More preferably, the groove has a depth in a direction of thickness of the lead frame. The groove may be as deep as the thickness of the lead frame, or only as deep as a partial thickness of the lead frame.

The groove may be formed by cutting a part of the lead frame.

Terminals of the multilayer chip capacitor may be electrically connected to the lead frame by soldering or by wire bonding.

According to the present invention, the multilayer chip capacitor is mounted in the groove on the lead frame, so that the total thickness of the resin-encapsulated IC module is smaller by the thickness of the lead frame. Accordingly, the IC module is thin although the multilayer chip capacitor having a precise capacitance and favorable temperature characteristics is used.

The multilayer chip capacitor may be a multilayer ceramic chip capacitor.

Furthermore, by electrically connecting the multilayer chip capacitor with the lead frame by soldering or wire bonding, the strength of bonding of the multilayer chip capacitor with the lead frame is ensured.

The present invention, in another aspect thereof, provides a wireless information-storage medium comprising a substrate having formed thereon a circuit pattern including an antenna coil; and an IC module mounted on the substrate so as to be connected to a circuit pattern of the antenna coil; wherein the IC module includes a lead frame having terminals that are connected to the antenna coil; and an IC chip and a multilayer chip capacitor mounted on the lead frame.

The multilayer chip capacitor is preferably mounted in a groove on the lead frame, the groove having a depth in a direction of thickness of the lead frame.

Terminals of the multilayer chip capacitor may be electrically connected to the lead frame by soldering or by wire bonding.

The manufacturing precision of the capacitance of the multilayer chip capacitor is ±2% to ±5%, which is higher than ±10% manufacturing precision of the capacitance of a film capacitor. Furthermore, a multilayer chip capacitor with an extremely high manufacturing precision of ±0.5% can be used. Accordingly, desired tuning precision can be satisfied without performing a post-process such as trimming. Furthermore, since variation of dielectric loss tangent of the multilayer chip capacitor in relation to temperature change is smaller compared with that of the film capacitor. Accordingly, the multilayer chip capacitor exhibits good temperature characteristics regardless of ambient temperature. Furthermore, although the multilayer chip capacitor is thicker than the film capacitor, an IC module or wireless information medium can be implemented in a thin structure by the thickness of the lead frame since the multilayer chip capacitor is mounted in the groove on the lead frame in the IC module. Furthermore, the IC module according to the present invention can be implemented in a small two-dimensional area since the multilayer chip capacitor is used, increasing flexibility in design of a card.

The present invention, in yet another aspect thereof, provides a method of manufacturing an IC module including a lead frame that is to be connected to an antenna coil for carrying out communication with an external communication device, and including an IC chip and a multilayer chip capacitor mounted on the lead frame and encapsulated by a resin, the method including the steps of preparing a lead-frame original board having an IC mounting region for mounting an IC chip, a groove for containing a multilayer chip capacitor, and a predetermined pattern formed thereon; mounting an IC chip and a multilayer chip capacitor on the lead-frame original board and connecting terminals of the multilayer chip capacitor to the lead-frame original board; encapsulating the IC chip and the multilayer chip capacitor except for peripheral portions of the lead-frame original board; and forming terminals for connection with the antenna coil by cutting the lead-frame original board so that the IC module is insulated except where the IC chip and the multilayer chip capacitor are formed.

The groove preferably has a depth in a direction of thickness of the lead-frame original board.

As described above, according to the present invention, a thin IC module including a capacitor having a precise capacitance and favorable temperature characteristics, and a wireless information-storage medium and a wireless information transmitting/receiving apparatus, are provided.

DESCRIPTION OF THE PREFERRED EMBODIMENTS

Now, embodiments of the present invention will be described with reference to the drawings.

Figure 1:
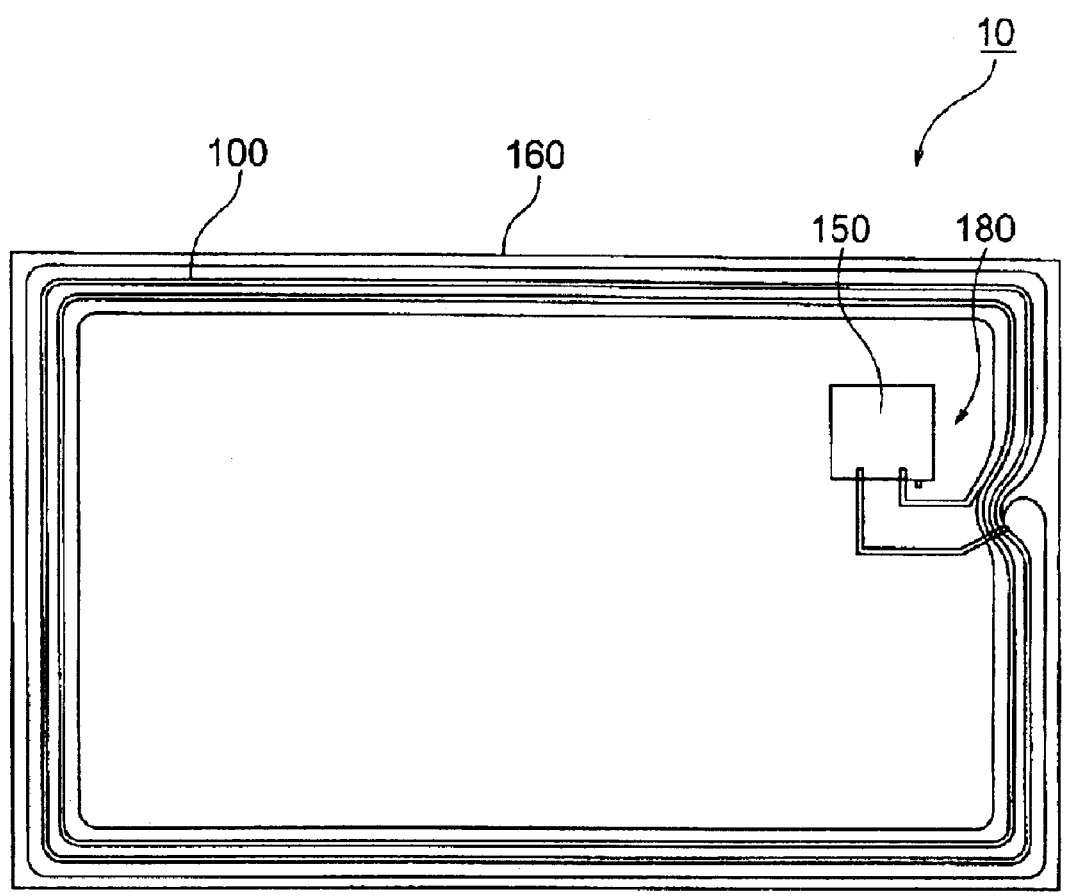
FIG. 1 is an overall plan view of an IC card, which is a wireless information-storage medium according to an embodiment of the present invention.
Figure 2A:
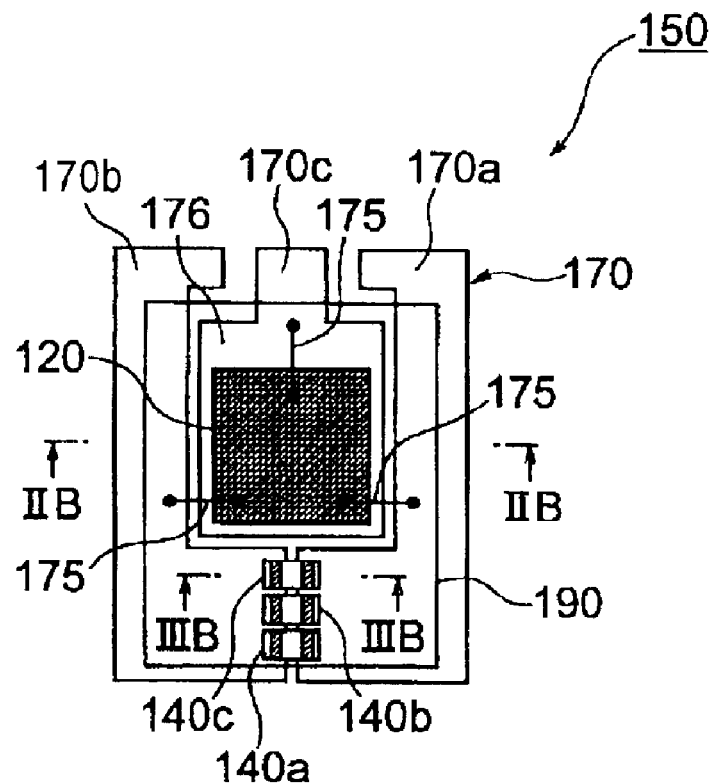
FIG. 2A is an enlarged plan view of an IC module shown in FIG. 1.
Figure 2B:
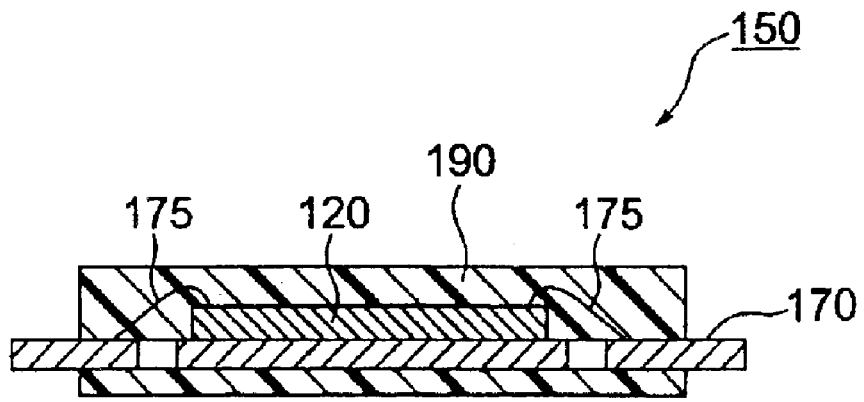
FIG. 2B is a sectional view taken along a line IIB—IIB in FIG. 2A.
Figure 3A:
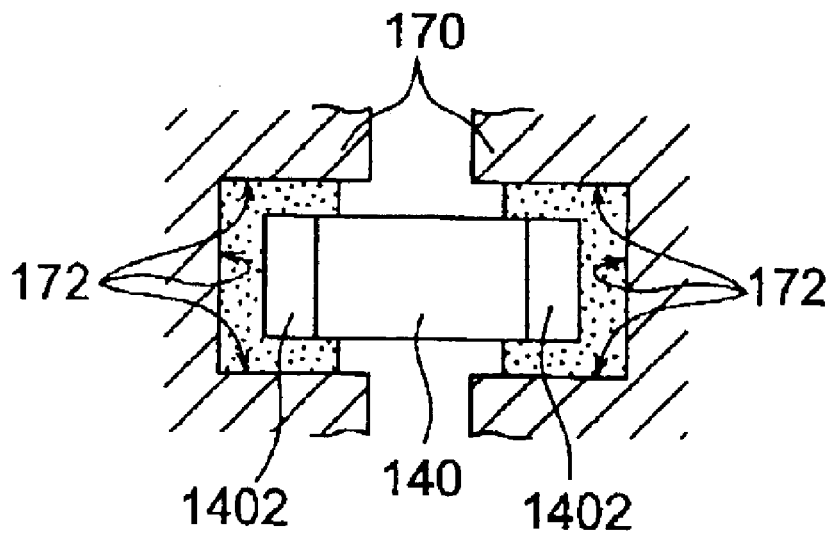
FIG. 3A is an enlarged plan view of a region where a chip capacitor is mounted in FIG. 2A.
Figure 3B:
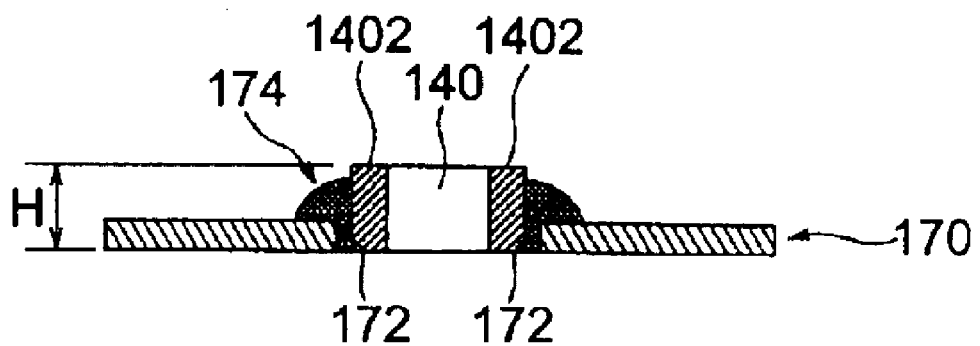
FIG. 3B is a sectional view taken along a line IIIB—IIIB in FIG. 2A.
Figure 4:
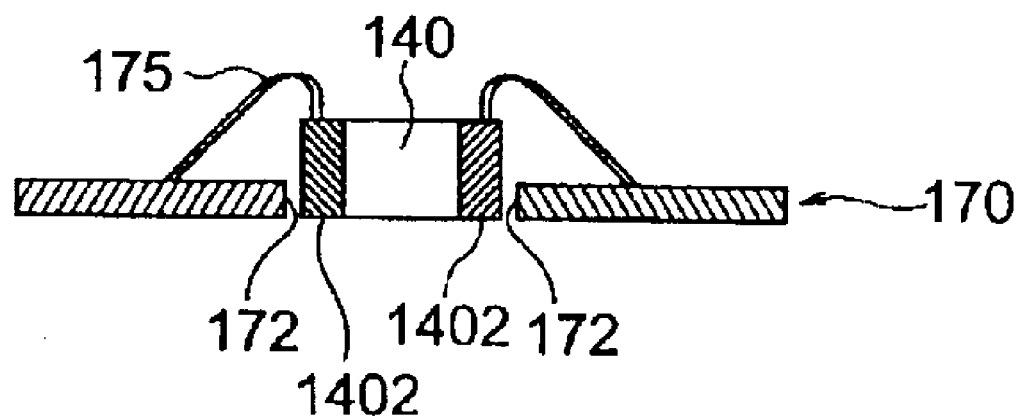
FIG. 4 is a sectional view showing another embodiment of the present invention, corresponding to the sectional view taken correspondingly to the line IIIB—IIIB in FIG. 2A.
Figure 5A:
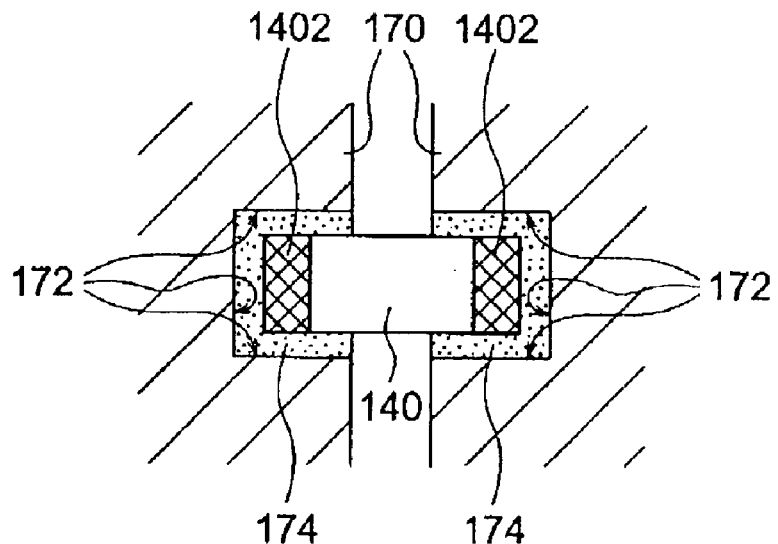
FIG. 5A is an enlarged plan view of a chip-capacitor mounting region in yet another embodiment of the present invention.
Figure 5B:
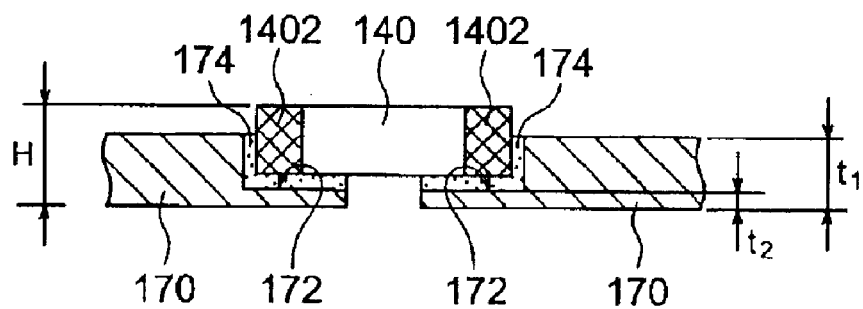
FIGS. 5B and 5C are sectional views taken correspondingly to the line IIIB—IIIB in FIG. 2A.
Figure 5C:
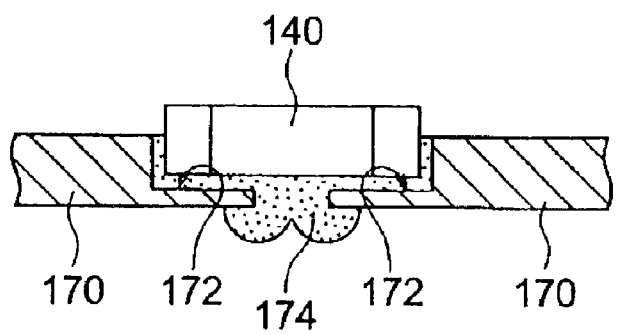

FIG. 1 is an overall plan view of an IC card, which is a wireless information-storage medium according to an embodiment of the present invention. FIG. 2A is an enlarged plan view of an IC module in the IC card shown in FIG. 1, and FIG. 2B is a sectional view taken along a line IIB—IIB in FIG. 2A. FIG. 3A is an enlarged plan view of a region where a chip capacitor is mounted in FIG. 2A, and FIG. 3B is a sectional view taken along a line IIIB—IIIB in FIG. 2A. FIG. 4 is a diagram showing another embodiment of the present invention, taken correspondingly to the line IIIB—IIIB in FIG. 2A. FIG. 5A is an enlarged plan view of a chip-capacitor mounting region in yet another embodiment of the present invention, and FIGS. 5B and 5C are sectional views taken correspondingly to the line IIIB—IIIB in FIG. 2A. FIGS. 6A to 6D are plan views showing processes for manufacturing the IC module shown in FIGS. 2A and 2B. FIG. 7 is an equivalent circuit diagram of the IC card shown in FIG. 1 and a reader/writer that is used therewith.

First, a wireless information-transmitting/receiving apparatus including the IC card according to this embodiment will be described with reference to FIG. 7. Referring to FIG. 7, an IC card 10 includes an antenna coil 100 that functions as an antenna, an IC chip 120, and tuning capacitors 140 (140a to 140c in FIG. 7) for tuning the signal frequency of the antenna.

The IC chip 120 includes a rectifier circuit 121, a power-supply stabilizing circuit 122, modem circuits 123 and 124, a memory 125, and a CPU or sequencer 126. Data is written to or read from the memory 125 by wireless communications with a reader/writer 20.

The reader/writer 20 includes an antenna coil 200 that functions as an antenna, a modem circuit 210, and a CPU 220. When transmitting data to the IC card 10, the reader/writer modulates a carrier wave having a frequency of 13.56 MHz with the data to be transmitted and causes a resulting current to flow through the antenna coil 200. When receiving data from the IC card 10, the reader/writer 20 causes a current not modulated to flow through the antenna coil 200.

When the IC card 10 is placed in proximity to the antenna coil 200 of the reader/writer 20, an induced voltage is generated between terminals of the antenna coil 100 in the IC card 10 by electromagnetic induction. The IC chip 120 receives a power-supply voltage obtained by stabilizing the induced voltage, and receives data transmitted from the reader/writer 20 by demodulating a modulated wave.

On the other hand, when data stored in the memory 125 of the IC card 10 is to be transmitted to the reader/writer 20, a load Z is varied in accordance with data in the IC card 10, and the reader/writer 20 demodulates a modulated wave to detect the variation of the load Z of the antenna coil 100 of the IC card 10, whereby the data is transmitted from the IC card 10 to the reader/writer 20.

Data is transmitted and received between the IC card 10 and the reader/writer 20 as described above. A host computer or information processing apparatus that supervises the reader/writer 20 is allowed to check transportation tickets or manage room entry and exit.

Referring next to FIG. 1, the IC card 10 in this embodiment includes a film substrate 160 composed of a resin such as polyimide (PI) or polyethylene naphthalate (PEN). The film substrate 160 has a thickness of, for example, 25 $\mu$m. In the proximity of the periphery of a principal surface of the film substrate 160, the antenna coil 100 composed of copper or aluminum is formed. Furthermore, at the terminals of the antenna coil 100, a mounting region 180 for mounting an IC module 150 in which the IC chip 120 and the tuning capacitors 140 are integrally packaged is formed by a circuit pattern also composed of copper or aluminum. The circuit patterns that constitute the antenna coil 100 and the mounting region 180 have a thickness of, for example, 16 $\mu$m.

The film substrate 160 and the circuit patterns can be manufactured by forming a PI film or PEN film of a predetermined size, laminating a copper foil or aluminum foil on the PI film or PEN film, forming patterns of desired circuits, i.e., the antenna coil 100 and the mounting region 180 shown in FIG. 1 on the copper foil or aluminum foil, and removing unneeded portions by etching.

Referring next to FIGS. 2A and 2B, in the IC module 150 mounted on the mounting region 180, the single IC chip 120 and the three tuning capacitors 140a to 140c are electrically connected to a lead frame 170, and the IC chip 120 and the tuning capacitors 140 are packaged by an encapsulating resin 190. The lead frame 170 has terminals 170a and 170b that are connected to the terminals of the antenna coil 100, and a terminal 170c that is grounded. The number of the tuning capacitors 140 is not limited to three, and may be one, two, or four or more.

The tuning capacitors 140 in this embodiment are implemented by multilayer chip capacitors. Each of the multilayer chip capacitors 140 includes a plurality of dielectric layers and electrode layers alternately laminated in a middle region, and terminals 1402 on respective ends. Each of the multilayer chip capacitors 140 has a thickness on the order of 300 µm, which is thicker than a film capacitor; however, manufacturing precision of capacitance is ±2% to ±5%, and as high as ±0.5% for high-precision products.

For example, let it be assumed that a capacitance that is required for tuning is 34 pF and that a marketed product with a capacitance of 33 pF and a marketed product with a capacitance of 1 pF are used as the multilayer chip capacitors. The number of multilayer chip capacitors to be used may be chosen as appropriate in accordance with a capacitance that is required for tuning. Since the precision of capacitance of normal-precision products on the market is ±5%, if normal-precision products are used for all the multilayer chip capacitors, the resulting capacitance is (33 pF+1.65 pF)+(1 pF+0.05 pF), i.e., 32.3 pF to 35.7 pF. If a high-precision product with a precision of ±2% is used just for a capacitor with a capacitance of 33 pF, the resulting capacitance is (33 pF±0.66 pF)+(1 pF+0.05 pF), i.e., 33.29 pF to 34.71 pF. Since the precision of a film capacitor is on the order of ±10%, the resulting capacitance is 34 pF±3.4 pF, i.e., 30.6 pF to 37.4 pF, and the difference is obvious.

Furthermore, since the multilayer chip capacitors 140 have better temperature characteristics than film capacitors, variation of dielectric loss tangent is small even at high or low temperature, so that the signal frequency of the antenna coil is stable.

As shown in FIGS. 2A and 2B and FIGS. 3A and 3B, the multilayer chip capacitors 140a to 140c in this embodiment are mounted so as to be contained in grooves 172 on the lead frame 170, and the terminals 1402 and 1402 of the chip capacitors 140 are electrically connected to the lead frame 170 via a solder 174. The grooves 172 in this embodiment are formed through the lead frame 170 in a direction of thickness of the lead frame 170 by cutting a part of the lead frame 170. By disposing the multilayer chip capacitors 140 between the lead frame 170 and not above the lead frame 170, the height H in FIG. 3B is smaller by the thickness of the lead frame 170. Accordingly, use of the multilayer chip capacitors 140, which has been inhibited before, is allowed.

The multilayer chip capacitors 140 are electrically connected to the lead frame 170 by soldering in the example shown in FIGS. 3A and 3B. However, without limitation to soldering, for example, the electrode terminals 1402 and 1402 of the multilayer chip capacitors 140 may be electrically connected to the lead frame 170 by wire bonding using wires 175 composed of, for example, gold. In that case, by choosing the number of the wires 175 appropriately, the strength of mechanical bonding between the multilayer chip capacitors 140 and the lead frame 170 can be improved.

Although the grooves 172 is formed through the lead frame 170 in the thickness direction in the embodiment shown in FIGS. 3A and 3B and FIG. 4, according to the present invention, grooves are not limited thereto. That is, as shown in FIGS. 5A and 5B, the grooves 172 may be only as deep as a partial thickness of the lead frame 170. In this example, the multilayer chip capacitors 140 are mounted in a half-etched region of the lead frame 170 having a thickness of t1. Thus, the lead frame 170 has a thickness of t2 where the grooves 172 are formed; that is, the grooves 172 a depth of (t1–t2). The multilayer chip capacitors 140 are mounted so that the terminals 1402 and 1402 of the multilayer chip capacitors 140 are in electric contact with the grooves 172 via the solder 174.

In this case, although the height H of the multilayer chip capacitors 140 with the lead frame 170 is larger by the thickness t2 of the grooves 172 compared with the height in the embodiment shown in FIGS. 3A and 3B and FIG. 4, since lower surfaces of the multilayer chip capacitors 140 are in contact with the grooves 172 via the solder 174, the strength of bonding of the multilayer chip capacitors 140 is improved. Furthermore, since a lead-frame portion with a thickness of t2 exists where the grooves 172 are formed, solder is prevented from reaching the lower surface of the lead frame 170 through a gap in the lead frame 170 when the multilayer chip capacitors 140 are soldered onto the lead frame 170. Thus, formation of concavities and convexities on the lower surface of the lead frame 170 by the solder 174 is prevented. Furthermore, since the multilayer chip capacitors 140 can be mounted on the grooves 172 with a sufficient amount of solder, displacement of the multilayer chip capacitors 140 in manufacturing can be prevented.

The IC chip 120 is a semiconductor integrated circuit including a circuit represented by an equivalent circuit shown in FIG. 7. The IC chip 120 is mounted in the IC-chip mounting region 176 of the lead frame 170 shown in FIGS. 2A and 2B. The IC chip 120 is connected to the three terminals 170a to 170c of the lead frame 170, for example, by wire bonding using wires 175.

The lead frame 170 with the IC chip 120 and the three multilayer chip capacitors 140 described above mounted thereon is packaged by the encapsulating resin 190 such as an epoxy resin, as shown in FIGS. 2A and 2B. The lead frame 170 has exposed portions that are not covered by the encapsulating resin 190, which form the terminals 170a, 170b, and 170c of the IC module 150, respectively.

The packaged IC module 150 is mounted on the mounting region 180 of the IC card 10. Thus, the IC chip 120 and the multilayer chip capacitors 140 are protected even when a flexural force, load, or shock is exerted on the IC card 10. Accordingly, the IC card 10 is sufficiently robust to allow it to be carried in a pocket or pass holder.

Next, a method of manufacturing the IC module 150 according to this embodiment will be described with reference to FIGS. 6A to 6D. Specific values and materials given below are examples for facilitating understanding of the present invention, and are not intended to limit the scope of the present invention.

Figure 6A:
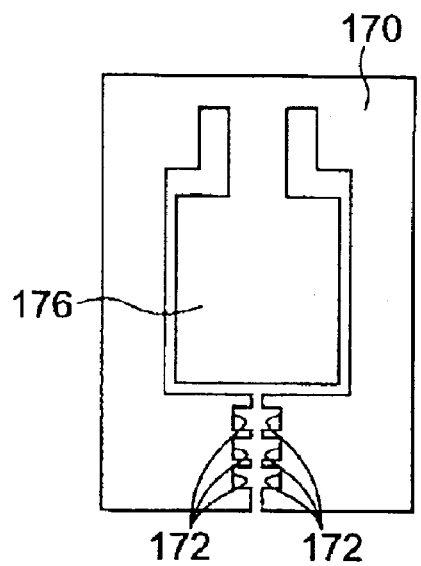
FIGS. 6A to 6D are plan views showing processes for manufacturing the IC module shown in FIGS. 2A and 2B.
Figure 6B:
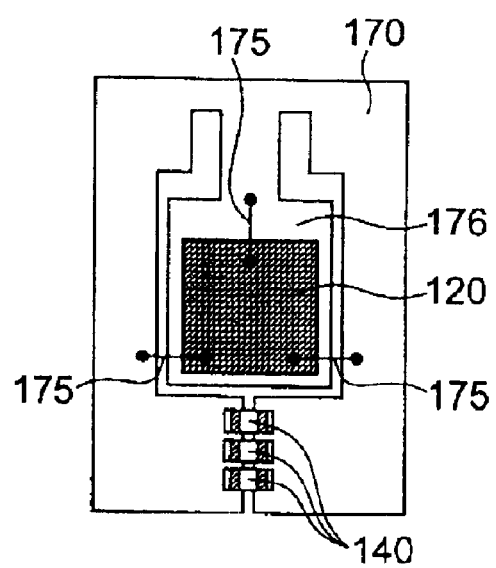
Figure 7:
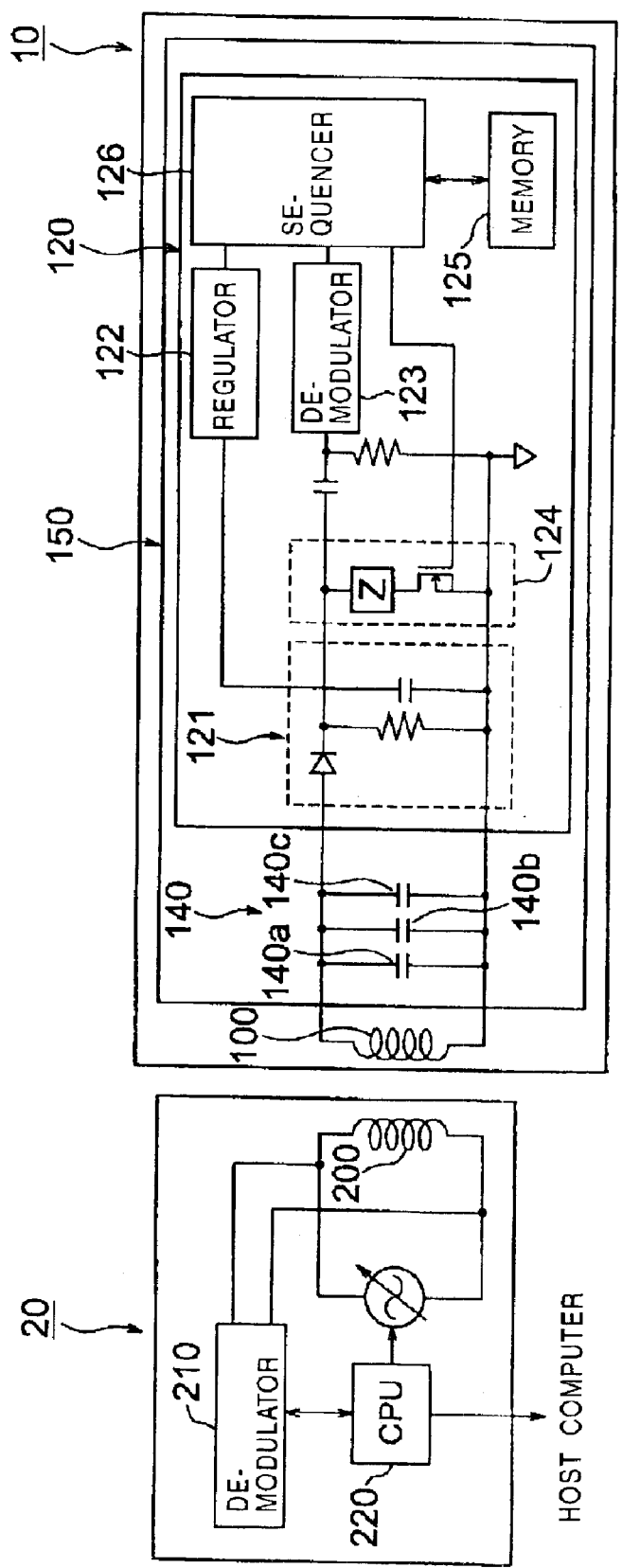
FIG. 7 is an equivalent circuit diagram of the IC card shown in FIG. 1 and a reader/writer that is used therewith.

First, an original board of the lead frame 170, with a predetermined pattern formed thereon as shown in FIG. 6A, is prepared. The original board of the lead frame 170 is an integrated product in which the three terminals 170a, 170b, 170c, which will be electrically insulated in the end, are all connected. The original board of the lead frame 170 has formed thereon the IC chip mounting region 176 for mounting the IC chip 120, and the three grooves 172 that allow the three multilayer chip capacitors 140a to 140c described earlier to be contained therein. The thickness of the lead frame 170 in this example is 100 μm.

On the original board of the lead frame 170, the multilayer chip capacitors 140 are mounted so as to be contained in the three grooves 172, and the terminals 1402 of the multilayer chip capacitors 140 are connected to the lead frame 170 by soldering. The soldering is achieved by pouring a solder paste into gaps between the multilayer chip capacitors 140 and the lead frame 170 and performing a reflow process, as shown in FIG. 3B. Then, the IC chip 120 is mounted in the IC-chip mounting region 176, and the IC chip 120 is electrically connected to each of the terminals 170a to 170c by wire bonding the wires 175.

Figure 6C:
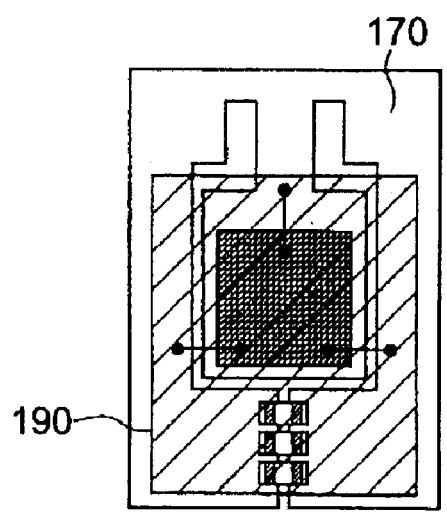
Figure 6D:
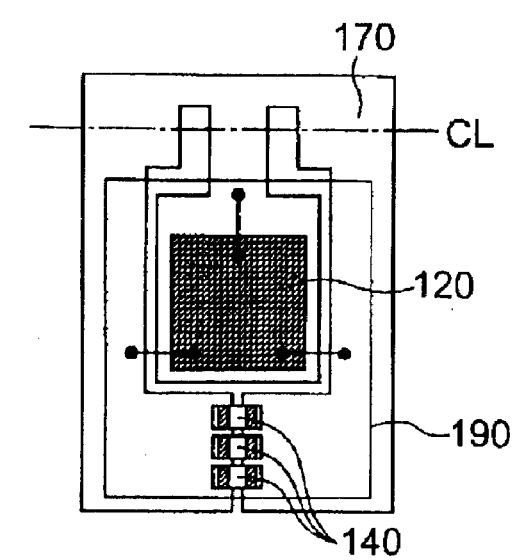

After the three multilayer chip capacitors 140a to 140c and the IC chip 120 are mounted on the original board of the lead frame 170, then, packaging is performed by covering the original board of the lead frame 170 by an encapsulating resin 190 such as an epoxy, except for peripheral portions of the lead frame 170 that will form the terminals 170a to 170c, as shown in FIG. 6C. After the packaging, the lead frame 170 is cut at a cutting plane CL shown in FIG. 6D. Thus, the three terminals 170a to 170c, which have been electrically connected on the original board, are insulated except where the IC chip 120 and the multilayer chip capacitors 140 are formed.

After the IC module 150 is formed in the manner described above, a sheet of a predetermined size, formed by laminating a 16-μm-thick copper foil on a principal surface of a 25-μm-thick polyimide film, is prepared. Then, circuit patterns, i.e., the antenna coil 100 and the mounting region 180 shown in FIG. 1, are formed on the copper foil of the sheet, and unneeded portions of the copper foil are removed by etching. Thus, a sheet having the copper circuit patterns formed on the principal surface of the polyimide film substrate 160 as shown in FIG. 1 is obtained. The size of the sheet may be the size of the IC card 10 to be manufactured. In mass production, however, the size of the sheet is preferably such that a large number of IC cards 10 can be obtained therefrom, the sheet being cut into the size of the IC card 10 in a final process. As an alternative to the sheet having the copper circuit patterns formed on the polyimide film substrate 160, a sheet having aluminum circuit patterns formed on a polyethylene naphthalate film substrate may be used.

Then, the IC module 150 is mounted at a position such that the terminals of the antenna coil 100 and the ground terminal in the mounting region 180 of the circuit patterns are connected to the terminals 170a to 170c of the IC module 150. The antenna coil 100 and the IC module 150 are connected, for example, by welding, using an anisotropic conductive film, or using a conductive tape.

The IC card 10 is formed in the manner described above. Furthermore, on upper and lower surfaces of the IC card 10, a filler resin layer composed of, for example, an epoxy resin, an exterior resin layer composed of, for example, polyethylene terephthalate, etc. may be formed as required.

An IC module or wireless information-storage medium according to the present invention is included in a communication device to allow communications with an external communication device that is capable of reading and writing. The wireless information-storage medium is not limited to that of a card shape.

The above description of the embodiments has been given in order to facilitate understanding of the present invention, and does not intend to limit the scope of the present invention. Thus, the components disclosed in the description of the embodiments are intended to cover any design modification and equivalents that are within the technical scope of the present invention.

What is claimed is:

1. An IC module comprising:
    a lead frame having terminals that are to be connected to an antenna coil for carrying out communication with an external communication device;
    an IC chip mounted on the lead frame;
    a multilayer chip capacitor mounted on the lead frame; and
    a resin for encapsulating the IC chip and the multilayer chip capacitor;
    wherein the multilayer chip capacitor is mounted in a groove on the lead frame.

2. An IC module according to claim 1, wherein the groove has a depth in a direction of thickness of the lead frame.

3. An IC module according to claim 2, wherein the groove is formed by cutting a part of the lead frame.

4. An IC module according to claim 1, wherein terminals of the multilayer chip capacitor are electrically connected to the lead frame by soldering or by wire bonding.

5. A wireless information-storage medium comprising:
    a substrate having formed thereon a circuit pattern including an antenna coil; and
    an IC module mounted on the substrate so as to be connected to a circuit pattern of the antenna coil;
    wherein the IC module comprises:
        a lead frame having terminals that are connected to the antenna coil;
        an IC chip mounted on the lead frame; and
        a multilayer chip capacitor mounted in a groove on the lead frame.

6. A wireless information-storage medium according to claim 5, wherein the groove has depth in a direction of thickness of the lead frame.

7. A wireless information-storage medium according to claim 6, wherein terminals of the multilayer chip capacitor are electrically connected to the lead frame by soldering or by wire bonding.

8. A method of manufacturing an IC module including a lead frame that is to be connected to an antenna coil for carrying out communication with an external communication device, and including an IC chip and a multilayer chip capacitor mounted on the lead frame and encapsulated by a resin, the method comprising the steps of:
    preparing a lead-frame original board having an IC mounting region for mounting an IC chip, a groove for containing a multilayer chip capacitor, and a predetermined pattern formed thereon;
    mounting the IC chip and the multilayer chip capacitor on the lead-frame original board and connecting terminals of the multilayer chip capacitor to the lead-frame original board;
    encapsulating the IC chip and the multilayer chip capacitor except for peripheral portions of the lead-frame original board; and
    forming terminals for connection with the antenna coil by cutting the lead-frame original board so that the IC module is insulated except where the IC chip and the multilayer chip capacitor are formed.

9. A method of manufacturing an IC module according to claim 8, wherein the groove has a depth in a direction of thickness of the lead-frame original board.

10. A wireless information-storage apparatus, comprising:
a substrate;
an antenna coil formed on the substrate; and
an IC module mounted on the substrate so as to be connected to the antenna coil;
wherein the IC module comprises:
a lead frame having terminals that are connected to the antenna coil;
an IC chip mounted on the lead frame; and
a multilayer chip capacitor mounted in a groove on the lead frame.

11. The wireless information-storage apparatus according to claim 10, wherein the groove has a depth in a direction of thickness of the lead frame.

12. The wireless information-storage apparatus according to claim 11, wherein the groove is formed by cutting at least a portion of the lead frame.

13. A wireless communication device, comprising:
a substrate;
an antenna coil formed on the substrate; and
an IC module mounted on the substrate so as to be connected to the antenna coil;
wherein the IC module comprises:
a lead frame connected to the antenna coil;
an IC chip mounted on the lead frame; and
at least one tuning capacitor mounted in a groove on the lead frame.

14. The wireless communication device according to claim 13, wherein the groove has a depth in a direction of thickness of the lead frame.

15. The wireless communication device according to claim 13, wherein the groove is formed by cutting at least a portion of the lead frame.

16. The wireless communication device according to claim 13, wherein the tuning capacitor comprises a multilayer chip capacitor.

17. The wireless communication device according to claim 16, wherein terminals of the multilayer chip capacitor are electrically connected to the lead frame by soldering or by wire bonding.

18. The wireless communication device according to claim 17, wherein lower surfaces of terminals of the multilayer chip capacitor are electrically connected to the lead frame by soldering.

19. The wireless communication device according to claim 13, wherein the wireless communication device is an integrated circuit card capable of communicating with an external communication device.

* * * * *